United States Patent [19]

Bhattacharyya et al.

[11] Patent Number: 5,345,363
[45] Date of Patent: Sep. 6, 1994

[54] METHOD AND APPARATUS OF COUPLING A DIE TO A LEAD FRAME WITH A TAPE AUTOMATED BONDED TAPE THAT HAS OPENINGS WHICH EXPOSE PORTIONS OF THE TAPE LEADS

[75] Inventors: Bidyut Bhattacharyya; Koushik Banerjee, both of Chandler, Ariz.

[73] Assignee: Intel Corporation, Santa Clara, Calif.

[21] Appl. No.: 44,286

[22] Filed: Apr. 7, 1993

[51] Int. Cl.$^5$ .................................................. H05K 1/00
[52] U.S. Cl. ....................................... 361/749; 361/723;
361/748; 361/772; 361/807; 174/52.4; 174/255; 257/690
[58] Field of Search ............... 361/718, 723, 736, 748, 361/760, 761, 767, 772, 773, 774, 777, 778, 803, 807, 813; 174/52.2, 52.4, 255, 261; 257/690, 692, 697, 786, 787

[56] References Cited

U.S. PATENT DOCUMENTS 5,177,863  1/1993  Lam ........................................ 29/830

FOREIGN PATENT DOCUMENTS 383296A   8/1990  European Pat. Off. .
62-249435 10/1987 Japan ..................................... 357/70
4078148   3/1992  Japan ..................................... 361/401

*Primary Examiner*—Leo P. Picard
*Assistant Examiner*—Young Whang
*Attorney, Agent, or Firm*—Blakely Sokoloff Taylor & Zafman

[57] ABSTRACT

An integrated circuit package which utilizes a standard TAB tape that can couple a lead frame to one of a number of integrated circuit dies that have different outer dimensions. The TAB tape includes a sheet of polyimide which supports a plurality of conductive leads. The sheet has a rectangular center opening which provides clearance for the IC die. Adjacent to each edge of the center opening are a plurality of equally spaced contact openings which expose portions of the leads. The leads are coupled to the integrated circuit by attaching the contact portions to the surface pads of the die. The contact openings are located at various distances from the center opening so that the tape can accommodate different die sizes. The leads of the TAB tape are also attached to a lead frame through lead frame openings in the polyimide.

7 Claims, 2 Drawing Sheets

METHOD AND APPARATUS OF COUPLING A DIE TO A LEAD FRAME WITH A TAPE AUTOMATED BONDED TAPE THAT HAS OPENINGS WHICH EXPOSE PORTIONS OF THE TAPE LEADS

BACKGROUND OF THE INVENTION

1. Field of the Invention

The present invention relates to an integrated circuit package.

2. Description of Related Art

Most commercially available integrated circuits (ICs) are housed within a plastic or ceramic package. The IC is typically coupled to a lead frame which has leads that extend from the exterior of the package. The leads are soldered to a printed circuit board which couples the IC to other electrical devices.

The lead frames are typically coupled to the integrated circuit die by using either a number of individual wires (wire bonding) or a tape which has a plurality of leads (TAB tape). Each TAB tape contains a sheet of dielectric which has a plurality of conductive leads etched into a pattern along one surface of the tape. The TAB tape is typically rectangular in shape and includes a center opening which provides clearance for the IC die. The leads each have a finger portion which extends beyond the center opening of the tape and are bonded to contact bumps located on the outer edge of the die.

To reduce the cost of producing integrated circuit packages, it is desirable to construct a single package which can house a variety of die sizes. Installing various size dies using conventional TAB tape requires that each tape be constructed so that the leads are long enough to attach the lead frame to the contact bumps of the die. This typically requires varying the size of the center opening so that the leads of the tape match the profile of the die. Each die size therefore has a corresponding TAB tape. Using a number of different TAP tape sizes, increases the complexity of assembling the package. It would therefore be desirable to have a single TAB tape which can couple a lead frame to any one of a number of different IC dies.

SUMMARY OF THE INVENTION

The present invention is an integrated circuit package which utilizes a standard TAB tape that can couple a lead frame to one of a number of integrated circuit dies that have different outer dimensions. The TAB tape includes a sheet of polyimide which supports a plurality of conductive leads. The sheet has a rectangular center opening which provides clearance for the IC die. Adjacent to each edge of the center opening are a plurality of equally spaced contact openings which expose portions of the leads. The leads are coupled to the integrated circuit by attaching the contact portions to the surface pads of the die. The contact openings are located at various distances from the center opening so that the tape can accommodate different die sizes. For example, a first die may be attached to the leads through the contact openings immediately adjacent to the center opening. The same TAB tape can be used to assemble a second larger die within a package, by attaching the leads to the die through the contact openings located farther away from the center opening. The leads of the TAB tape are also attached to a lead frame through lead frame openings in the polyimide.

It therefore is an object of the present invention to provide a TAB tape which can couple a lead frame to any one of a number of different size IC dies.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
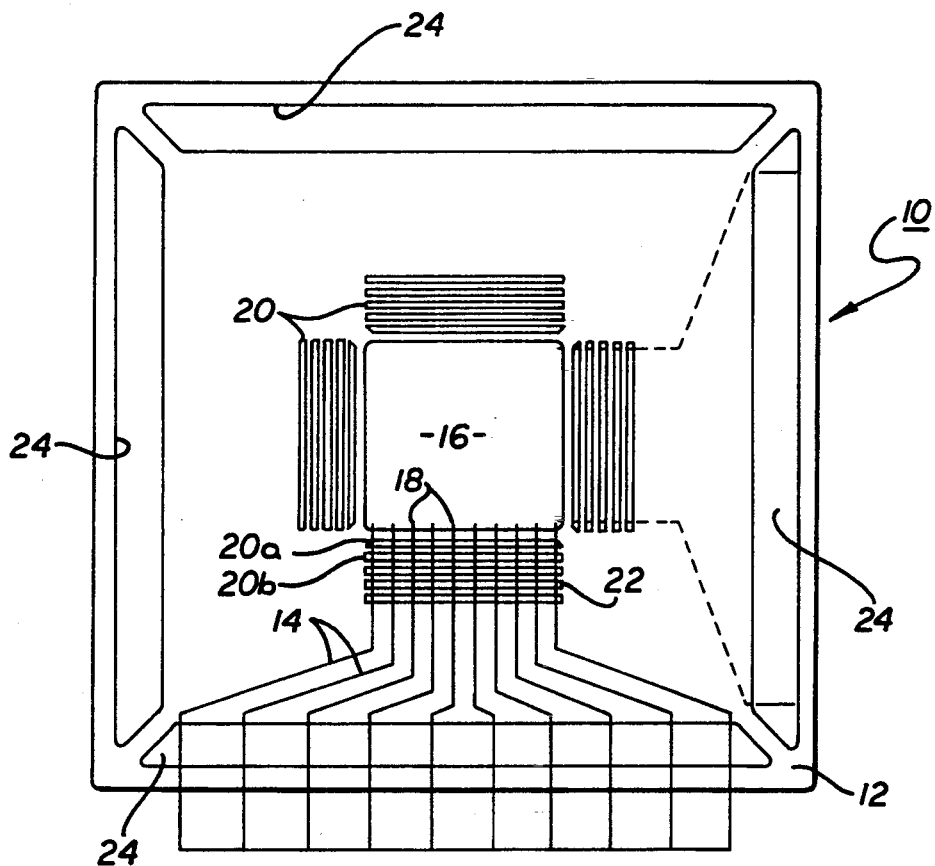
FIG. 1 is a top view of a TAB tape of the present invention.

Referring to the drawings more particularly by reference numbers, FIG. 1 shows a TAB (tape automated bonding) tape 10 of the present invention. The TAB tape 10 includes a layer of dielectric 12 which supports a plurality of conductive leads 14. The dielectric 12 is preferably a polyimide tape which is sold by E. I. duPont deNemours under the trademark KAPTON. The leads 14 are preferably etched from a copper sheet that is attached to the polyimide 12.

The TAB tape 10 is typically rectangular in shape and has a center opening 16. Each lead 14 has a finger portion 18 that extends into the center opening 16 in a cantilever fashion. Adjacent to, each edge of the center opening 16 are a number of contact openings 20. The die openings 20 expose unsupported contact portions 22 of the leads 14. The tape 10 also has four lead frame openings 24 which expose outer contact portions of the leads 14.

Figure 2:
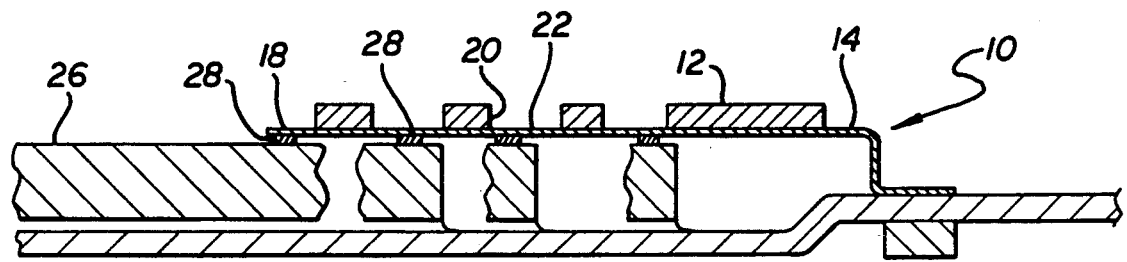
FIG. 2 is a side view of the TAB tape attached to an integrated circuit die.

As shown in FIG. 2, the tape 10 is coupled to an integrated circuit die 26 by attaching the leads 14 to corresponding contact pads 28 on the die 24. The leads 14 are attached to the pads 28 at either the finger portions 18, or the exposed contact portions 22 of one set of the contact openings 20. The contact pads 28 are typically gold bumps which elevate the tape 10 above the surface of the die 26. The polyimide 12 is preferably located opposite the die 26, so that the dielectric does not interfere with the attachment of the leads 14 to the contact pads 28. The leads 14 can be attached to the pads 28 with any conventional means known in the art, including ultrasonic/thermal diffusion techniques.

The contact openings 20 are spaced apart so that the TAB tape 10 can be used with one of many different IC die sizes. For example, the TAB tape shown and described can be used with a die 28 which has contact pads 28 located beneath the finger portions 18 of the leads, the exposed contact portions 22 within the first contact openings 20a, second contact opening 20b, and so forth and so on. Such an arrangement allows a single TAB tape 10 to be used with a number of different die sizes, without having to modify the tape. In the preferred embodiment, the tape can be attached to dies between 300 millimeters and 650 millimeters. The contact openings 20 may be located on 32 millimeter center spacing, so that the tape can accommodate various dies in 32 millimeter increments. The contact openings 20 are preferably 20 millimeters wide to provide enough exposed surface area to attach the leads 14 to the contact pads 28.

In the preferred embodiment, the contact pads 28 are approximately 25 microns high. Such a height is considered sufficient to insure that the leads 14 do not effect the operation of the integrated circuit 26. In the preferred embodiment, the die 26 will have two sets of contact pads 28. The first set of pads 28 will be attached to the exposed contact portions 22 of the leads, the second set of pads will be attached to the finger portions 18 of the leads. The inclusion of two pad sets reduces the cantilever effect of the leads 14, particularly for larger dies which are coupled to the leads 14 through the contact openings 20 farthest away from the center opening 16.

Figure 3:
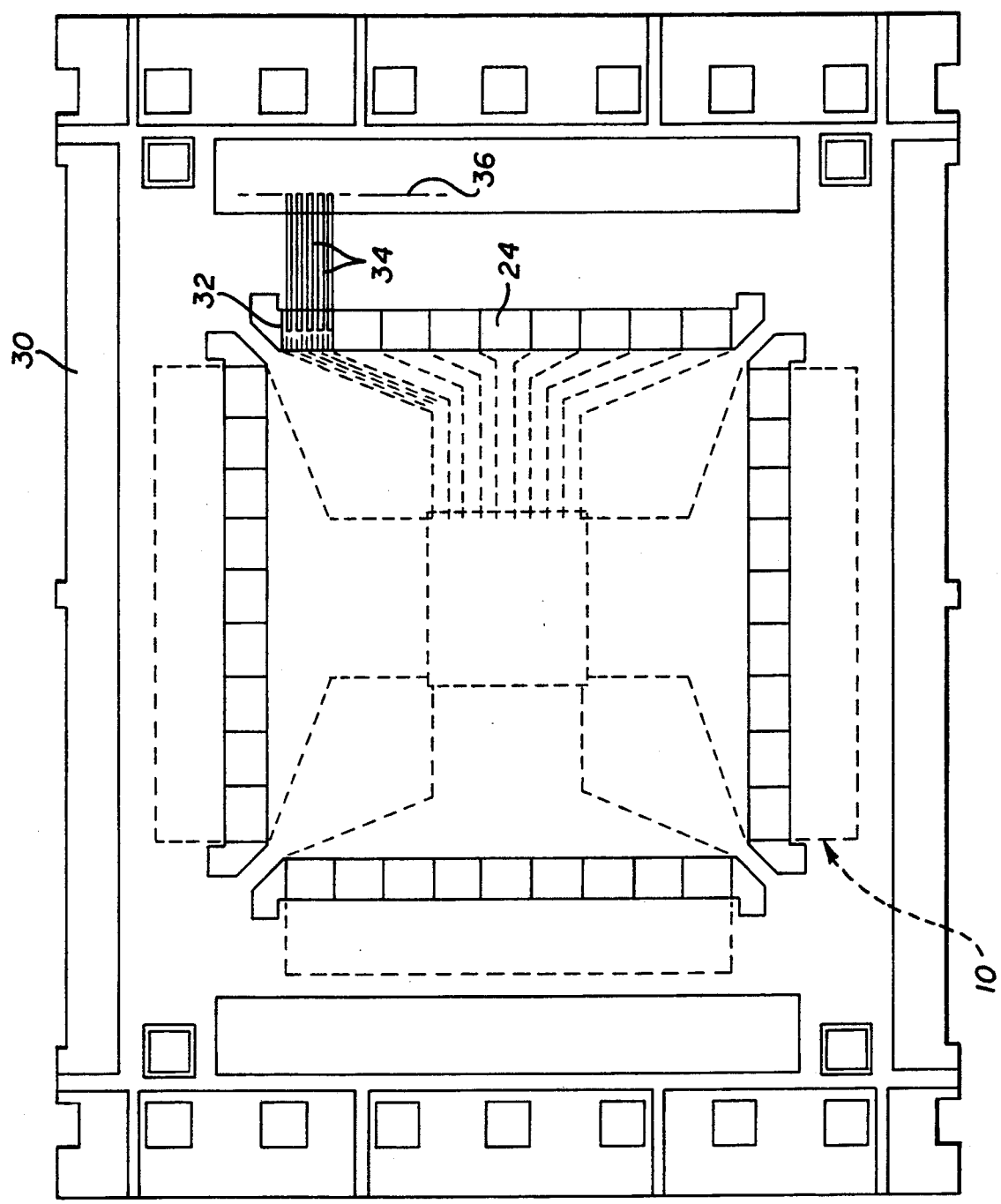
FIG. 3 is a top view of the TAB tape attached to a die and lead frame.

AS shown in FIG. 3, the tape 10 is also coupled to a lead frame 30 by attaching the exposed portions 32 of the leads 14 within the lead frame openings 24 to the individual leads 34 of the lead frame 30. After assembly, both the tape 10 and the lead frame 30 are cut at the lines designated 36 to separate the individual leads 34. The die/tape/lead frame assembly is integrated within a plastic or ceramic package which can be mounted to a printed circuit board. As shown in FIG. 2, the lead frame 34 preferably has a raised portion which is supported by four die post 38 that engage designated corner leads of the frame 34.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A type automated bonded tape that couples an integrated circuit to a lead frame of an integrated circuit package, comprising:
   a tape having a layer of dielectric which supports a plurality of tape leads that couple a plurality of pads of a die with a plurality of leads of a lead frame, said layer of dielectric having a center opening defined by four sides, said tape further having four groups of contact openings each group being adjacent to a side of said center opening and which expose contact portions of said tape leads, each group having at least two adjacent contact openings.

2. The package as recited in claim 1, wherein said tape leads each have a finger portion which extends beyond said layer of dielectric and into said center opening.

3. The package as recited in claim 1, wherein said layer of dielectric has a lead frame opening which exposes said tape leads to said lead frame.

4. An integrated circuit package, comprising:
   a rectangular die which has a plurality of pads along each edge of said die;
   a rectangular lead frame having a lead frame center opening and a plurality of leads arranged along each edge of said lead frame opening; and,
   a rectangular coupling tape having a layer of dielectric which supports a plurality of tape leads that couple said pads of said die with said leads of said lead frame, said layer of dielectric having a rectangular center opening defined by four sides, said rectangular coupling tape further having four groups of contact openings each group being adjacent to a side of said center opening and a plurality of contact openings which expose contact portions of said tape leads, each group having at least two adjacent contact openings.

5. The package as recited in claim 4, wherein said tape leads each have finger portions which extend beyond said layer of dielectric and into said center opening.

6. A method for constructing an integrated circuit package, comprising the steps of:
   a) providing a coupling tape which has a layer of dielectric which supports a plurality of tape leads, said layer of dielectric having a center opening defined by four sides, said tape further having four groups of contact openings each group being adjacent to a side of a said center opening and which expose contact portions of tape leads, each group having at least adjacent contact openings;
   c) placing said coupling tape adjacent to a die such that said exposed contact portions are aligned with a plurality of pads of an integrated circuit; and,
   d) attaching said exposed contact portions to said pads.

7. The method as recited in claim 6, further comprising the step of attaching said traces to a plurality of leads of a lead frame through a lead frame opening in said layer of dielectric.

* * * * *

UNITED STATES PATENT AND TRADEMARK OFFICE
CERTIFICATE OF CORRECTION

PATENT NO. : 5,345,363
DATED : 9/6/94
INVENTOR(S) : Bidyut Bhattacharyya and Koushik Banerjee It is certified that error appears in the above-indentified patent and that said Letters Patent is hereby corrected as shown below:

Column 2, Line 32;   Delete ","
Column 3, Line 14;   Delete "AS";      Insert in place thereof --As--
Column 3, Line 36;   Delete "type";    Insert in place thereof --tape--

Signed and Sealed this

Fourteenth Day of November, 1995

Attest:

BRUCE LEHMAN

Attesting Officer      Commissioner of Patents and Trademarks